United States Patent
Mimura et al.

(10) Patent No.: US 11,669,113 B2
(45) Date of Patent: Jun. 6, 2023

(54) TEMPERATURE CONTROL DEVICE

(71) Applicant: KELK Ltd., Kanagawa (JP)

(72) Inventors: Kazuhiro Mimura, Kanagawa (JP); Atsushi Kobayashi, Kanagawa (JP)

(73) Assignee: KELK Ltd., Kanagawa (JP)

( * ) Notice: Subject to any disclaimer, the term of this patent is extended or adjusted under 35 U.S.C. 154(b) by 0 days.

(21) Appl. No.: 17/311,220

(22) PCT Filed: Nov. 15, 2019

(86) PCT No.: PCT/JP2019/044978
§ 371 (c)(1),
(2) Date: Jun. 4, 2021

(87) PCT Pub. No.: WO2020/137245
PCT Pub. Date: Jul. 2, 2020

(65) Prior Publication Data
US 2022/0100215 A1 Mar. 31, 2022

(30) Foreign Application Priority Data

Dec. 27, 2018 (JP) .............................. JP2018-246199

(51) Int. Cl.
*H01L 21/67* (2006.01)
*G05D 23/19* (2006.01)
*F24H 15/414* (2022.01)

(52) U.S. Cl.
CPC ........ *G05D 23/1931* (2013.01); *F24H 15/414* (2022.01); *H01L 21/67248* (2013.01); *F24H 2250/06* (2013.01)

(58) Field of Classification Search
CPC . F24H 15/414; H01L 21/67248; G05D 23/19; G05D 23/1931; F25B 21/02
See application file for complete search history.

(56) References Cited

U.S. PATENT DOCUMENTS

2009/0080159 A1 3/2009 Ippoushi et al.
2014/0138075 A1 5/2014 Yang et al.
(Continued)

FOREIGN PATENT DOCUMENTS

CN 101893296 11/2010
CN 105242541 1/2016
(Continued)

OTHER PUBLICATIONS

PCT International Search Report in International Appln. No. PCT/JP2019/044978, dated Dec. 10, 2019, 2 pages.

*Primary Examiner* — Gregory A Wilson
(74) *Attorney, Agent, or Firm* — Fish & Richardson P.C.

(57) ABSTRACT

A temperature control device includes a smoother including a smoothing channel through which fluid from a first inlet flows, and a first outlet from which the fluid flowed through the smoothing channel flows out, the smoother making a temperature fluctuation amount of the fluid in the first outlet smaller than that in the first inlet, a thermoregulator including a second inlet into which the fluid from the first outlet flows, a thermoregulating channel through which the fluid from the second inlet flows, a thermoregulating unit regulating a temperature of the fluid flowing through the thermoregulating channel, and a second outlet from which the fluid flowed through the thermoregulating channel flows out, calculating a temperature regulation amount of the thermoregulating unit, based on temperature of the fluid in the smoothing channel, and calculating the temperature regulation amount, based on temperature of the fluid at a position downstream of the second outlet.

12 Claims, 6 Drawing Sheets

(56) References Cited

U.S. PATENT DOCUMENTS

2015/0200429 A1     7/2015   Lee et al.
2015/0206776 A1     7/2015   Mimura

FOREIGN PATENT DOCUMENTS

| | | | |
|---|---|---|---|
| JP | H10270453 | 10/1998 | |
| JP | 2006196766 | 7/2006 | |
| JP | 2007032273 | 2/2007 | |
| JP | 2013117827 | 6/2013 | |
| JP | 2014041593 | 3/2014 | |
| TW | 201421622 | 6/2014 | |
| TW | 201528590 | 7/2015 | |
| WO | WO-2013080930 A1 * | 6/2013 | ......... G05D 23/1919 |
| WO | WO-2020145082 A1 * | 7/2020 | ......... G05D 23/1393 |

* cited by examiner

TEMPERATURE CONTROL DEVICE

CROSS-REFERENCE TO RELATED APPLICATIONS

This application is a National Stage application of International Application No. PCT/JP2019/044978, filed on Nov. 15, 2019, which claims priority to Japanese Patent Application No. 2018-246199, filed on Dec. 27, 2018. The contents of the prior applications are incorporated herein in their entirety.

FIELD

The present invention relates to a temperature control device.

BACKGROUND

In the technical field related to semiconductor manufacturing devices or precision processing devices, temperature control devices are known that control the temperature of an object with a fluid the temperature of which has been regulated by a heater, as disclosed in Patent Literature 1.

CITATION LIST

Patent Literature

Patent Literature 1: JP 2013-117827 A

SUMMARY

Technical Problem

In the technology disclosed in Patent Literature 1, a tank is installed upstream of a heater (a thermoregulator), and an attempt is made to estimate the temperature behavior in the tank by approximating the dynamic characteristics of the tank with a dead time and a first-order lag system. However, the behavior of the fluid in the tank is complicated, and thus, it is difficult to make an approximation with a simple dead time and a first-order lag system. Accordingly, the estimated value of the temperature behavior is not highly likely to give desired results. In addition, the tank needs to have a certain volume to fulfill the function of the tank, and furthermore, a temperature sensor needs to be provided upstream of the tank, which makes the temperature control device very large.

An aspect of the present invention aims to accurately regulate the temperature of a fluid, and furthermore to reduce or prevent the upsizing of a temperature control device.

Solution to Problem

According to an aspect of the present invention, a temperature control device comprises: a smoother including a first inlet into which a fluid flows, a smoothing channel through which the fluid having flowed from the first inlet flows, and a first outlet from which the fluid having flowed through the smoothing channel flows out, the smoother being configured to make a temperature fluctuation amount of the fluid in the first outlet smaller than a temperature fluctuation amount of the fluid in the first inlet; a thermoregulator including a second inlet into which the fluid having flowed out from the first outlet flows, a thermoregulating channel through which the fluid having flowed from the second inlet flows, a thermoregulating unit configured to regulate a temperature of the fluid flowing through the thermoregulating channel, and a second outlet from which the fluid having flowed through the thermoregulating channel flows out; a first temperature sensor configured to detect a temperature of the fluid at a first position set in the smoothing channel; a second temperature sensor configured to detect a temperature of the fluid at a second position downstream of the second outlet; a feedforward control unit configured to calculate a temperature regulation amount by which the thermoregulating unit regulates the temperature, on a basis of detection data of the first temperature sensor; and a feedback control unit configured to calculate a temperature regulation amount by which the thermoregulating unit regulates the temperature, on a basis of detection data of the second temperature sensor.

Advantageous Effects of Invention

According to an aspect of the present invention, it is possible to accurately regulate the temperature of a fluid.

DESCRIPTION OF EMBODIMENTS

Hereinafter, while embodiments according to the present invention will be described with reference to the drawings, the present invention is not limited thereto. The components of the embodiments described below can be combined as appropriate. In addition, some of the components may not be used.

[Temperature Control Device]

Figure 1:
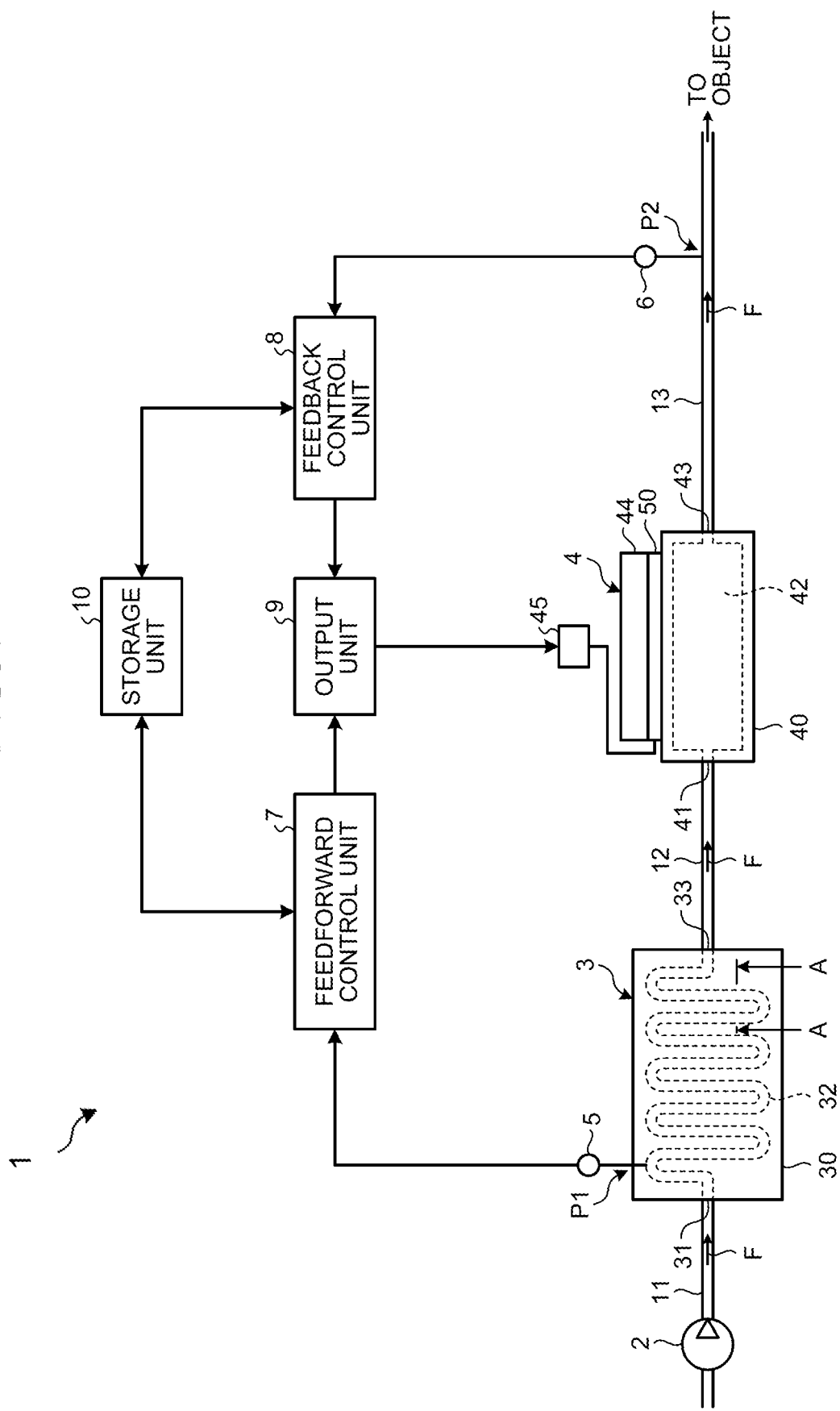
FIG. 1 is a schematic diagram illustrating an example of a temperature control device according to an embodiment.

FIG. 1 is a schematic diagram illustrating an example of a temperature control device 1 according to an embodiment. As illustrated in FIG. 1, the temperature control device 1 includes a pump 2, a smoother 3, a thermoregulator 4, a first temperature sensor 5, a second temperature sensor 6, a feedforward control unit 7, a feedback control unit 8, an output unit 9, and a storage unit 10.

The pump 2 sends out a fluid F. The fluid F is a thermoregulation fluid for regulating the temperature of an object. The fluid F may be a liquid or a gas. Assume that the fluid F is a liquid in the embodiment.

The smoother 3 has a first inlet 31 into which the fluid F supplied from the pump 2 flows, a smoothing channel 32 through which the fluid F having flowed from the first inlet 31 flows, and a first outlet 33 from which the fluid F having flowed through the smoothing channel 32 flows out. An outlet of the pump 2 and the first inlet 31 are connected via a first pipe 11. The fluid F sent out from the pump 2 is supplied to the first inlet 31 via the first pipe 11.

The smoother 3 makes a temperature fluctuation amount $\Delta T_{out}$ of the fluid F at the first outlet 33 smaller than a temperature fluctuation amount $\Delta T_{in}$ of the fluid F at the first inlet 31 by the action of the smoothing channel 32. The fluid F that flows into the first inlet 31 may change in temperature in predetermined cycles. In a case where the fluid F that flows into the first inlet 31 changes in temperature, the smoothing channel 32 smooths a temperature fluctuation amount $\Delta T$ of the fluid F. The fluid F is stirred by flowing through the smoothing channel 32. The stirring of the fluid F in the smoothing channel 32 gradually reduces the temperature fluctuation amount $\Delta T$ of the fluid F.

Figure 2:
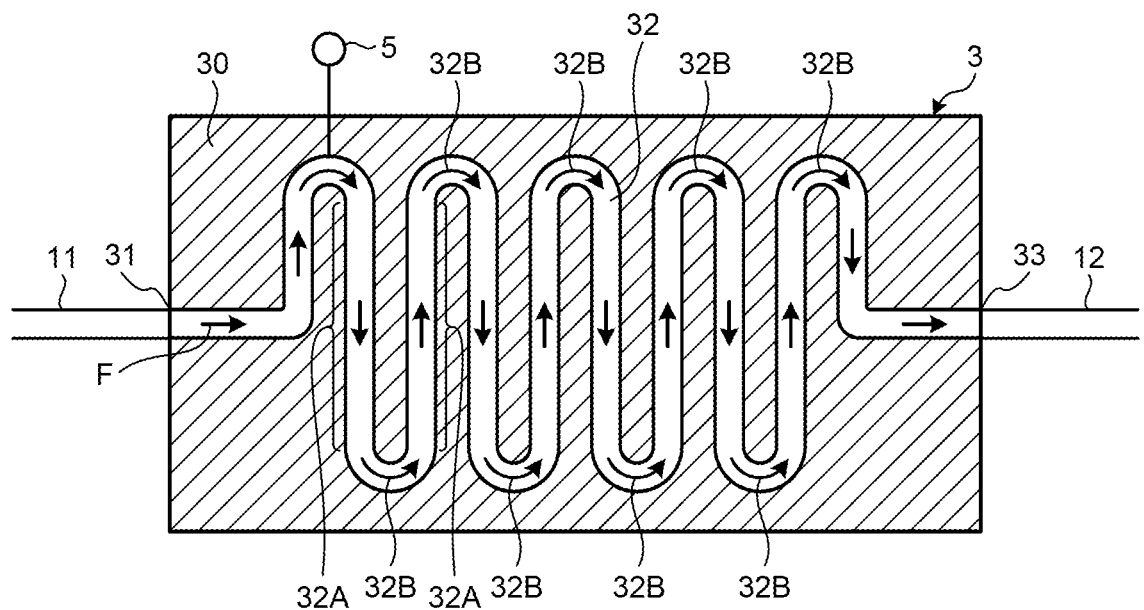
FIG. 2 is a sectional view illustrating an example of a smoother according to the embodiment.

FIG. 2 is a sectional view illustrating an example of the smoother 3 according to the embodiment. As illustrated in FIG. 2, the smoother 3 includes a body member 30. The smoothing channel 32 is provided inside the body member 30. The first inlet 31 is provided on one end face of the body member 30. The first outlet 33 is provided on another end face of the body member 30. The smoothing channel 32 connects the first inlet 31 and the first outlet 33.

The smoothing channel 32 includes a plurality of straight portions 32A and a plurality of curved potions 32B. The plurality of straight portions 32A is arranged substantially parallel to one another. The curved portions 32B each connect end portions of adjacent straight portions 32A. The fluid F having flowed into the smoothing channel 32 from the first inlet 31 flows through the straight portions 32A and the curved potions 32B, alternately. The flow-through direction of the fluid F is reversed at each of the curved potions 32B. The reversing of the flow-through direction of the fluid F causes the fluid F to be stirred. The stirring of the fluid F gradually makes the temperature fluctuation amount $\Delta T$ of the fluid F smaller by the fluid F being passed through the smoothing channel 32, even in a case where the temperature of the fluid F has changed in the first inlet 31. Thus, the temperature fluctuation amount $\Delta T_{out}$ of the fluid F at the first outlet 33 is made smaller than the temperature fluctuation amount $\Delta T_{in}$ of the fluid F at the first inlet 31.

Note that the smoother 3 can be manufactured by, for example, forming a channel groove that becomes the smoothing channel 32 in a surface of a first plate member and then joining a second plate member to the surface of the first plate member.

Figure 3:
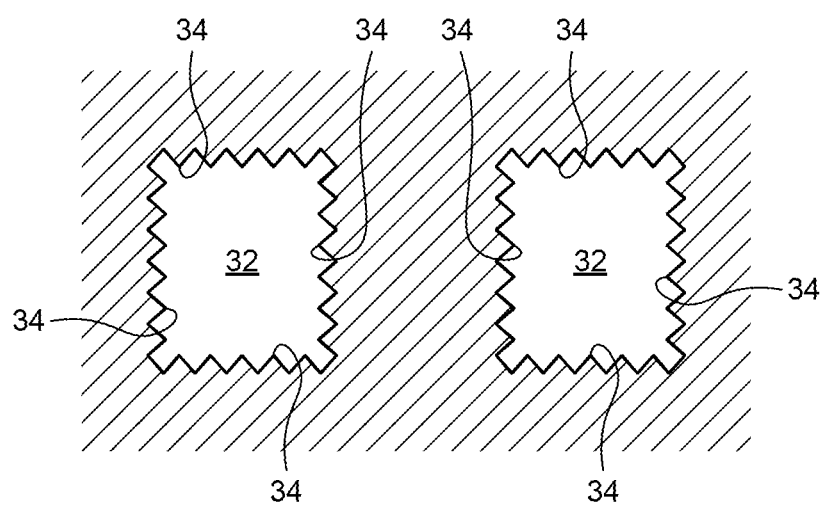
FIG. 3 is an enlarged sectional view of a part of a smoothing channel according to the embodiment.

FIG. 3 is an enlarged sectional view of a part of the smoothing channel 32 according to the embodiment. FIG. 3 corresponds to a sectional view taken along the line A-A in FIG. 1. As illustrated in FIG. 3, the inside surfaces of the smoothing channel 32 include rough portions 34. The rough portions 34 may be formed by, after forming the channel groove in the surface of the first plate member, performing surface roughening on the inside surfaces of the channel groove or by providing a plurality of minute grooves in the inside surfaces of the channel groove. The provision of the rough portions 34 in the inside surfaces of the smoothing channel 32 facilitates the stirring of the fluid F that is flowing through the smoothing channel 32. This enables the smoother 3 to make the temperature fluctuation amount $\Delta T_{out}$ of the fluid F at the first outlet 33 smaller than the temperature fluctuation amount $\Delta T_{in}$ of the fluid F at the first inlet 31.

The thermoregulator 4 includes a second inlet 41 into which the fluid F having flowed from the first outlet 33 of the smoother 3 flows, a thermoregulating channel 42 through which the fluid F having flowed from the second inlet 41 flows, a thermoregulating unit 50 that regulates a temperature T of the fluid F flowing through the thermoregulating channel 42, and a second outlet 43 from which the fluid F having flowed through the thermoregulating channel 42 flows out. The first outlet 33 and the second inlet 41 are connected via a second pipe 12. The fluid F having flowed out from the first outlet 33 is supplied to the second inlet 41 via the second pipe 12.

Figure 4:
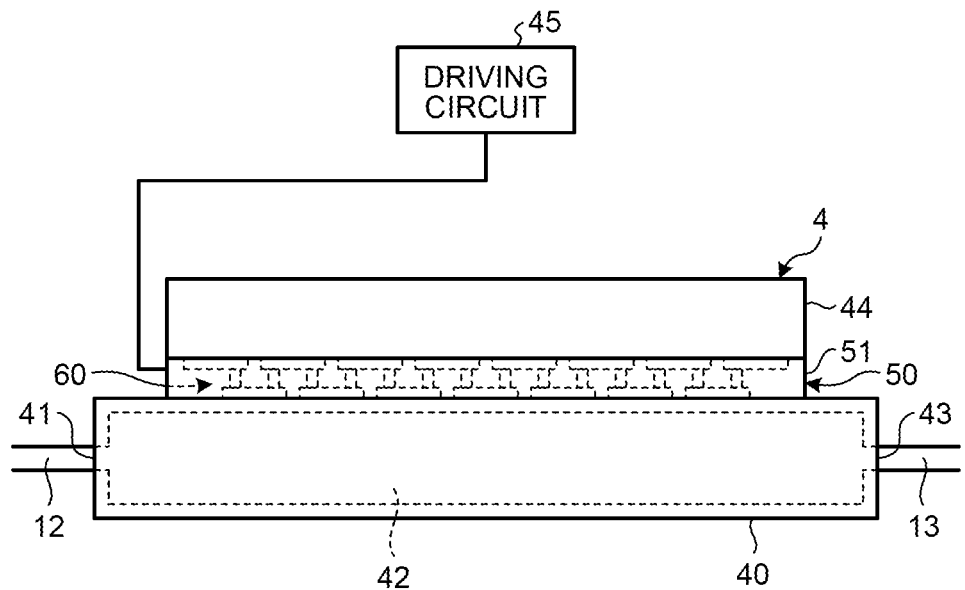
FIG. 4 is a diagram schematically illustrating an example of a thermoregulator according to the embodiment.

FIG. 4 is a diagram schematically illustrating an example of the thermoregulator 4 according to the embodiment. As illustrated in FIG. 4, the thermoregulator 4 includes a body member 40, the thermoregulating unit 50 which is connected to the body member 40, a heat exchanger plate 44 which is connected to the thermoregulating unit 50, and a driving circuit 45 which drives the thermoregulating unit 50.

The thermoregulating channel 42 is provided inside the body member 40. The second inlet 41 is provided on one end face of the body member 40. The second outlet 43 is provided on another end face of the body member 40. The thermoregulating channel 42 connects the second inlet 41 and the second outlet 43.

The thermoregulating unit 50 regulates the temperature T of the fluid F flowing through the thermoregulating channel 42 via the body member 40. The thermoregulating unit 50 includes thermoelectric modules 60. The thermoregulating unit 50 regulates the temperature T of the fluid F using the thermoelectric modules 60.

The thermoelectric modules 60 absorb or liberate heat to regulate the temperature T of the fluid F flowing through the thermoregulating channel 42. The thermoelectric modules 60 absorb or liberate heat by a supply of electric power. The thermoelectric modules 60 absorb or liberate heat using the Peltier effect.

The heat exchanger plate 44 exchanges heat with the thermoregulating unit 50. The heat exchanger plate 44 includes an internal channel (not illustrated) through which a thermoregulation fluid flows. The temperature of the thermoregulation fluid is regulated by a fluid-temperature control device (not illustrated), and then the thermoregulation fluid flows into the internal channel of the heat exchanger plate 44. The thermoregulation fluid flows through the internal channel, and takes heat from the heat exchanger plate 44 or gives heat to the heat exchanger plate 44. The thermoregulation fluid flows out from the internal channel and is returned to the fluid-temperature control device.

Figure 5:
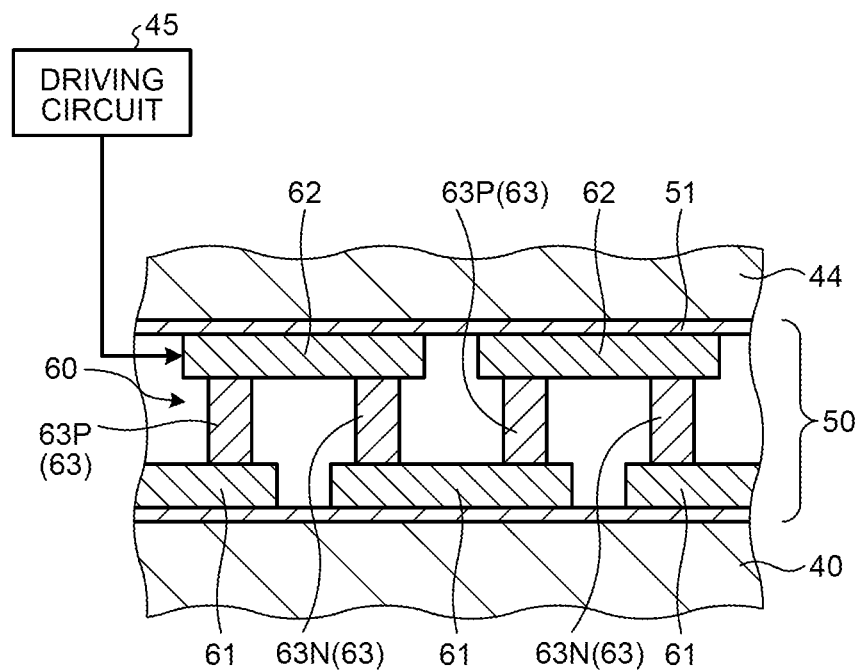
FIG. 5 is an enlarged sectional view of a part of a thermoregulating unit according to the embodiment.

FIG. 5 is an enlarged sectional view of a part of the thermoregulating unit 50 according to the embodiment. As illustrated in FIG. 5, the thermoregulating unit 50 includes the plurality of thermoelectric modules 60 and a case 51 for accommodating the plurality of thermoelectric modules 60. One end face of the case 51 is connected to the body member 40. Another end face of the case 51 is connected to the heat exchanger plate 44.

The thermoelectric modules 60 each include a first electrode 61, a second electrode 62, a thermoelectric semiconductor component 63. Each thermoelectric semiconductor component 63 includes a p-type thermoelectric semiconductor component 63P and an n-type thermoelectric semiconductor component 63N. Each first electrode 61 is connected to the respective p-type thermoelectric semiconductor component 63P and the respective n-type thermoelectric semiconductor component 63N. Each second electrode 62 is connected to the respective p-type thermoelectric semiconductor component 63P and the respective n-type thermoelectric semiconductor component 63N. The first electrodes 61 are adjacent to the body member 40. The second electrodes 62 are adjacent to the heat exchanger plate 44. One end face of the respective p-type thermoelectric semiconductor component 63P and one end face of the respective n-type thermoelectric semiconductor component 63N are each connected to the respective first electrode 61. Another end face of the respective p-type thermoelectric semiconductor component 63P and another end face of the respective n-type thermoelectric semiconductor component 63N are each connected to the respective second electrode 62.

The thermoelectric modules 60 absorb or liberate heat using the Peltier effect. The driving circuit 45 supplies the thermoelectric modules 60 with electric power for causing the thermoelectric modules 60 to absorb or liberate heat. The driving circuit 45 gives a potential difference between the first electrode 61 and the second electrode 62. In response to the potential difference being given between the first electrode 61 and the second electrode 62, electric charges transfer in the thermoelectric semiconductor component 63. The transfer of the electric charges transfers heat in the thermoelectric semiconductor component 63. This causes the thermoelectric modules 60 to absorb or liberate heat. For example, if a potential difference between the first electrode 61 and the second electrode 62 is given so that the first electrode 61 liberates heat and the second electrode 62 absorbs heat, the fluid F that is flowing through the thermoregulating channel 42 is heated. If a potential difference between the first electrode 61 and the second electrode 62 is given so that the first electrode 61 absorbs heat and the second electrode 62 liberates heat, the fluid F that is flowing through the thermoregulating channel 42 is cooled.

The driving circuit 45 converts a manipulated variable MV into electric power (potential difference) to be given to the thermoelectric modules 60. The electric power converted by the driving circuit 45 is given to the thermoelectric modules 60. The electric power to be given to the thermoelectric modules 60 is regulated, so that adsorption of heat or liberation of heat to be performed by the thermoelectric modules 60 is regulated. The adsorption of heat or the liberation of heat to be performed by the thermoelectric modules 60 is regulated, so that the temperature of the fluid F that is flowing through the thermoregulating channel 42 is regulated. A temperature regulation amount by which the temperature of the fluid F is regulated by the thermoregulating unit 50 includes at least either one of an amount of heat absorption and an amount of heat liberation which are performed by the thermoelectric modules 60.

The second outlet 43 is connected to a third pipe 13. The fluid F the temperature of which has been regulated by the thermoregulating unit 50 flows out from the second outlet 43, and is supplied to an object via the third pipe 13. The object refers to an object to be subjected to temperature control of the temperature control device 1.

The first temperature sensor 5 detects a temperature $T_{in}$ of the fluid F at a first position P1 upstream of the first outlet 33. In the embodiment, the first position P1 is set in the smoothing channel 32. In other words, the first temperature sensor 5 is provided on the smoother 3, and detects the temperature $T_{in}$ of the fluid F that is flowing through the smoothing channel 32.

The second temperature sensor 6 detects a temperature $T_{out}$ of the fluid F at a second position P2 downstream of the second outlet 43. In the embodiment, the second position P2 is set in the third pipe 13. In other words, the second temperature sensor 6 is provided on the third pipe 13, and detects the temperature $T_{out}$ of the fluid F that is flowing through the third pipe 13.

The feedforward control unit 7 calculates a temperature regulation amount $MV_{ff}$ by which the temperature of the fluid F is regulated by the thermoregulating unit 50, on the basis of detection data of the first temperature sensor 5. The temperature regulation amount $MV_{ff}$ includes at least either one of an amount of heat absorption and an amount of heat liberation which are performed by the thermoelectric modules 60. The detection data of the first temperature sensor 5 indicates the temperature $T_{in}$ of the fluid F at the first position P1 upstream of the first outlet 33. The first temperature sensor 5 outputs the detection data indicating the temperature $T_{in}$ of the fluid F at the first position P1 to the feedforward control unit 7. The feedforward control unit 7 calculates the temperature regulation amount $MV_{ff}$ for performing feedforward control on the thermoregulating unit 50 so that the temperature of the thermoregulating unit 50 reaches a target temperature Tr, on the basis of the detection data of the first temperature sensor 5.

The feedback control unit 8 calculates a temperature regulation amount $MV_{fb}$ by which the temperature of the fluid F is regulated by the thermoregulating unit 50, on the basis of detection data of the second temperature sensor 6. The temperature regulation amount $MV_{fb}$ includes at least either one of an amount of heat absorption and an amount of heat liberation which are performed by the thermoelectric modules 60. The detection data of the second temperature sensor 6 indicates the temperature $T_{out}$ of the fluid F at the second position P2 downstream of the second outlet 43. The second temperature sensor 6 outputs the detection data indicating the temperature $T_{out}$ of the fluid F at the second position P2 to the feedback control unit 8. The feedback control unit 8 calculates the temperature regulation amount $MV_{fb}$ for performing feedback control on the thermoregulating unit 50 so that the temperature of the thermoregulating unit 50 reaches the target temperature Tr, on the basis of the detection data of the second temperature sensor 6.

The output unit 9 outputs the manipulated variable MV for controlling the thermoregulating unit 50 on the basis of the temperature regulation amount $MV_{ff}$ by which the thermoregulating unit 50 regulates the temperature and which is calculated by the feedforward control unit 7, and the temperature regulation amount $MV_{fb}$ by which the thermoregulating unit 50 regulates the temperature and which is calculated by the feedback control unit 8. The output unit 9 outputs the manipulated variable MV to the driving circuit 45. In the embodiment, the manipulated variable MV for controlling the thermoregulating unit 50 is converted into electric power (potential difference) to be provided to the thermoelectric modules 60.

The driving circuit 45 obtains the manipulated variable MV output from the output unit 9. The driving circuit 45 regulates the thermoelectric modules 60 on the basis of the electric power into which the manipulated variable MV is converted.

In the embodiment, the feedforward control unit 7 calculates the temperature regulation amount $MV_{ff}$ by which the temperature of the fluid F is regulated by the thermoregulating unit 50, on the basis of the detection data of the first temperature sensor 5, dynamic characteristics including a dead time L of the thermoregulating unit 50, and dynamic characteristics of the first temperature sensor.

The dead time L refers to a lag time in transmission from the time when a control signal output from the output unit 9 is input to the driving circuit 45 of the thermoregulating unit 50 to the time when the control signal is output as a temperature from the thermoregulating unit 50.

The dead time L may occur, due to the dynamic characteristics of the thermoregulating unit 50, between the time when a control signal for attaining the target temperature Tr of the thermoregulating unit 50 is input to the driving circuit 45 and the time when the temperature of the thermoregulating unit 50 reaches the target temperature Tr. The feedforward control unit 7 calculates the temperature regulation amount $MV_{ff}$ to reflect the dead time L of the thermoregulating unit 50. The dead time L of the thermoregulating unit 50 is, for example, known data that can be derived from specification data on the thermoregulating unit 50, and is stored in the storage unit 10 in advance. Note that the dead time L of the thermoregulating unit 50 may be derived through a preparatory experiment or a simulation, and the resultant may be stored in the storage unit 10 in advance. The feedforward control unit 7 obtains the dead time L of the thermoregulating unit 50 from the storage unit 10. The feedforward control unit 7 calculates the temperature regulation amount $MV_{ff}$ on the basis of the dead time L obtained from the storage unit 10.

In the embodiment, a flow-through necessary time FT which is a time required for the fluid F to flow from the first position P1 to the second inlet 41 is longer than the dead time L. In other words, the first position P1 at which the first temperature sensor 5 is installed is set so that the flow-through necessary time FT is longer than the dead time L.

For example, if a volume of a channel between the first position P1 and the second inlet 41 is denoted as V (L) and a flow quantity of the fluid F that is sent out from the pump 2 is denoted as Q (L/min), the flow-through necessary time FT (sec.) is expressed by the following Equation (1).

$$FT = \frac{60 \times V}{Q} \quad (1)$$

In the embodiment, the volume of the channel between the first position P1 and the second inlet 41 is the sum of a part of the volume of the smoothing channel 32 and the volume of the channel of the second pipe 12. For example, in a case where the first position P1 is set in the first inlet 31, the volume of the channel between the first position P1 and the second inlet 41 is the sum of the entire volume of the smoothing channel 32 and the volume of the channel of the second pipe 12.

The feedforward control unit 7 calculates, on the basis of the detection data of the first temperature sensor 5, the dynamic characteristics of the thermoregulator 4 including the dead time L, the dynamic characteristics of the first temperature sensor 5, and the flow-through necessary time FT, the temperature regulation amount $MV_{ff}$ to cancel a change, from the target temperature Tr, in the temperature $T_{in}$ of the fluid F.

[Temperature Control Method]

Figure 6:
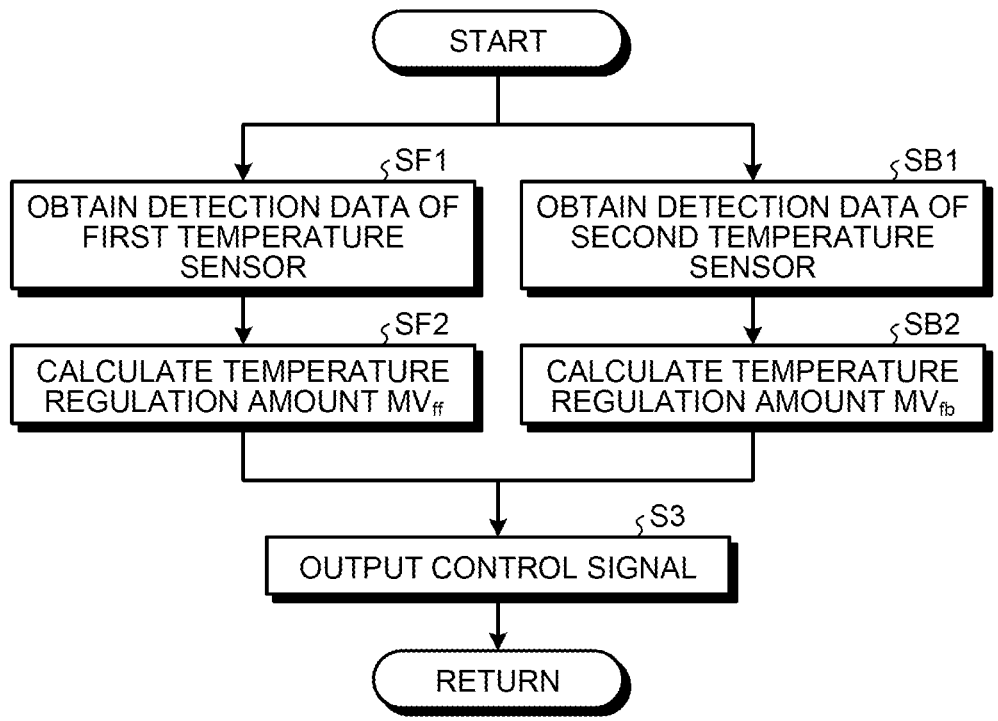
FIG. 6 is a flowchart illustrating an example of a temperature control method according to the embodiment.

Next, a method of controlling temperature performed by the temperature control device 1 will be described. FIG. 6 is a flowchart illustrating an example of a temperature control method according to the embodiment.

The pump 2 sends out the fluid F. The fluid F sent out from the pump 2 flows through the first pipe 11, and then flows into the smoothing channel 32 of the smoother 3 via the first inlet 31. The fluid F having flowed through the smoothing channel 32 flows out from the first outlet 33, and then flows through the second pipe 12. After that, the fluid F flows into the thermoregulating channel 42 of the thermoregulator 4 via the second inlet 41. The fluid F having flowed through the thermoregulating channel 42 flows out from the second outlet 43, and flows through the third pipe 13. After that, the fluid F is supplied to the object.

The first temperature sensor 5 detects a temperature $T_{in}$ of the fluid F at a first position P1 upstream of the first outlet 33. The first temperature sensor 5 detects the temperature $T_{in}$ of the fluid F before the temperature regulation is performed by the thermoregulator 4. The detection data of the first temperature sensor 5 is output to the feedforward control unit 7. The feedforward control unit 7 obtains the detection data of the first temperature sensor 5 (Step SF1).

The feedforward control unit 7 calculates the temperature regulation amount $MV_{ff}$ by which the thermoregulating unit 50 regulates the temperature, on the basis of the detection data of the first temperature sensor 5, the dynamic characteristics of the thermoregulator 4 including the dead time L stored in the storage unit 10, the dynamic characteristics of the first temperature sensor 5, and the flow-through necessary time FT (Step SF2).

The feedforward control unit 7 calculates, on the basis of the detection data of the first temperature sensor 5, the dynamic characteristics of the thermoregulator 4 including the dead time L, the dynamic characteristics of the first temperature sensor 5, and the flow-through necessary time FT, the temperature regulation amount $MV_{ff}$ to cancel a change, from the target temperature Tr, in the temperature $T_{in}$ of the fluid F.

Figure 7:
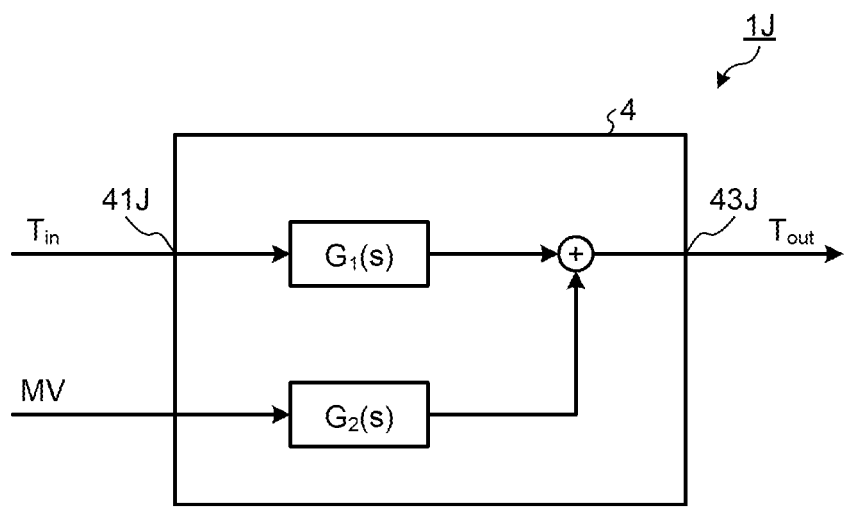
FIG. 7 is a block diagram illustrating dynamic characteristics of the thermoregulator according to the embodiment.

FIG. 7 is a block diagram illustrating dynamic characteristics of the thermoregulator 4 according to the embodiment. As illustrated in FIG. 7, the dynamic characteristics of the thermoregulator 4 corresponds to the sum of dynamic characteristics $G_1(s)$ of the fluid F that is flowing through the thermoregulator 4 and the dynamic characteristics $G_2(s)$ of the thermoregulating unit 50. In FIG. 7, $T_{in}$ refers to the temperature of the fluid F at a first position P1J upstream of an inlet 41J of the thermoregulator 4, and $T_{out}$ is the temperature of the fluid F at a second position P2J downstream of an outlet 43J of the thermoregulator 4. MV refers to a manipulated variable for the thermoregulating unit 50.

That the fluid F before being supplied to the thermoregulator 4 changes in temperature means that a disturbance d exhibiting a temperature fluctuation is given to the temperature $T_{in}$. If the dynamic characteristics of the feedforward control unit 7 is denoted as $G_{ff}(s)$, the following Equation (2) holds. In Equation (2), $G_{ts1}(s)$ refers to the dynamic characteristics of the first temperature sensor 5.

$$G_1(s) \times d + G_{ff}(s) \times G_2(s) \times G_{ts1}(s) \times d = 0 \quad (2)$$

From Equation (2), the dynamic characteristics $G_{ff}(s)$ of the feedforward control unit 7 is expressed by the flowing Equation (3).

$$G_{ff}(s) = -\frac{G_1(s)}{G_2(s) \times G_{ts1}(s)} \quad (3)$$

In a case where the dead time L (sec.) is present in the dynamic characteristics $G_2(s)$ of the thermoregulating unit 50, the dynamic characteristics $G_2(s)$ is expressed by the following Equation (4).

$$G_2(s) = \overline{G}_2(s) \cdot e^{-Ls} \qquad (4)$$

Therefore, in a case where the dead time L (sec.) is present in the dynamic characteristics $G_2(s)$, the dynamic characteristics $G_{ff}(s)$ of the feedforward control unit 7 is expressed by the following Equation (5).

$$G_{ff}(s) = -\frac{G_1(s)}{\overline{G}_2(s) \times G_{ts1}(s)} e^{Ls} \qquad (5)$$

In Equation (5), $e^{Ls}$ represents future dynamic characteristics, and thus, the dynamic characteristics $G_{ff}(s)$ indicated in Equation (5) does not hold as the dynamic characteristics of the feedforward control unit 7. Thus, the dynamic characteristics $G_{ff}(s)$ of the feedforward control unit 7 is expressed by an approximate expression in which the dead time L is ignored, such as Equation (6) described below.

$$G_{ff}(s) \approx -\frac{G_1(s)}{\overline{G}_2(s) \times G_{ts1}(s)} \qquad (6)$$

Equation (6) is an approximate expression in which the dead time L is ignored in spite of the presence of the dead time L in the thermoregulating unit 50 in practice. In a case where the feedforward control unit 7 expressed by the approximate expression such as Equation (6) performs feedforward control, the temperature control of the fluid F performed by the thermoregulating unit 50 may not be in time if the dead time L is longer than the flow-through necessary time FT.

In the embodiment, the flow-through necessary time FT is longer than the dead time L. Accordingly, the feedforward control unit 7 calculates the dynamic characteristics $G_{ff}(s)$ indicated by the following Equation (7).

$$G_{ff}(s) = -\frac{G_1(s)}{\overline{G}_2(s) \times G_{ts1}(s)} e^{-(FT-L)s} \qquad (7)$$

The feedforward control unit 7 can calculate the temperature regulation amount $MV_{ff}$ without the approximation of the dead time, from Equation (7).

The second temperature sensor 6 detects a temperature $T_{out}$ of the fluid F at a second position P2 downstream of the second outlet 43. The second temperature sensor 6 detects the temperature $T_{out}$ of the fluid F after the temperature regulation is performed by the thermoregulator 4. The detection data of the second temperature sensor 6 is output to the feedback control unit 8. The feedback control unit 8 obtains the detection data of the second temperature sensor 6 (Step SB1).

The feedback control unit 8 calculates the temperature regulation amount $MV_{fb}$ by which the thermoregulating unit 50 regulates the temperature, on the basis of the detection data of the second temperature sensor 6 (Step SB2).

The output unit 9 calculates the manipulated variable MV for attaining the target temperature Tr of the thermoregulating unit 50 on the basis of the temperature regulation amount $MV_{ff}$ calculated in Step SF2 and the temperature regulation amount $MV_{fb}$ calculated in Step SB2, and outputs, to the driving circuit 45, a control signal converted into electric power (Step S3).

The driving circuit 45 obtains the control signal that has been converted into electric power and has been output from the output unit 9. The driving circuit 45 regulates the manipulated variable MV (electric power) to be given to the thermoelectric modules 60 on the basis of the control signal.

Advantageous Effects

As described above, according to the embodiment, the provision of the smoother 3 controls the temperature fluctuation of the fluid F that is to be supplied to the thermoregulator 4. Moreover, according to the embodiment, the feedforward control performed by the feedforward control unit 7 and the feedback control performed by the feedback control unit 8 can be combined. The performing of the feedforward control enables the control of the thermoregulating unit 50 with high responsiveness. This results in accurate regulation of the temperature of the fluid F.

In a case where, for example, merely a tank is provided upstream of the thermoregulator 4, the behavior of the fluid F inside the tank is complicated, so that it is difficult to model the tank with an estimation model including a dead time element and a first-order lag system element. As a result, it is difficult to perform feedforward control in which the dead time L is sufficiently reflected.

According to the embodiment, the smoother 3 is provided upstream of the thermoregulator 4. The smoother 3 includes the smoothing channel 32. The behavior of the fluid F inside the smoothing channel 32 is simple compared with that inside the tank, so that the smoother 3 can be modeled with an estimation model including a dead time element and a first-order lag system element. Thus, the feedforward control unit 7 can perform feedforward control in which the dead time L is sufficiently reflected.

The flow-through necessary time FT which is a time required for the fluid F to flow from the first position P1 to the second inlet 41 is longer than the dead time L of the thermoregulating unit 50. In other words, the first position P1 at which the first temperature sensor 5 is installed is set so that the flow-through necessary time FT is longer than the dead time L. This enables the feedforward control unit 7 to calculate the temperature regulation amount $MV_{ff}$ so that the temperature of the thermoregulating unit 50 is equalized with the target temperature Tr before the fluid F at the first position P1 at which the temperature $T_{in}$ is detected by the first temperature sensor 5 reaches the second inlet 41, on the basis of the detection data of the first temperature sensor 5 and the dead time L.

In the embodiment, the first position P1 is set in the smoothing channel 32. In other words, the first temperature sensor 5 is provided in the smoother 3. This arrangement prevents upsizing of the temperature control device 1.

In the embodiment, the smoothing channel 32 includes the curved portions 32B. The fluid F is stirred in the curved portions 32B, and thus, the temperature fluctuation amount $\Delta T_{out}$ can be reduced. The smoothing channel 32 is provided with the plurality of curved portions 32B, and thus, the fluid F is sufficiently stirred. Moreover, the smoothing channel 32 is provided with the plurality of curved portions 32B, and thus, the length of the channel from the first position P1 to the second inlet 41 is increased while upsizing of the smoother 3 is prevented. In other words, it is possible to increase the flow-through necessary time FT while upsizing of the smoother 3 is prevented.

The inside surfaces of the smoothing channel 32 include the rough portions 34. The provision of the rough portions 34 leads to generation of a turbulent flow of the fluid F. Thus, the fluid F is stirred, so that the temperature fluctuation amount $\Delta T_{out}$ can be reduced.

[Computer System]

Figure 8:
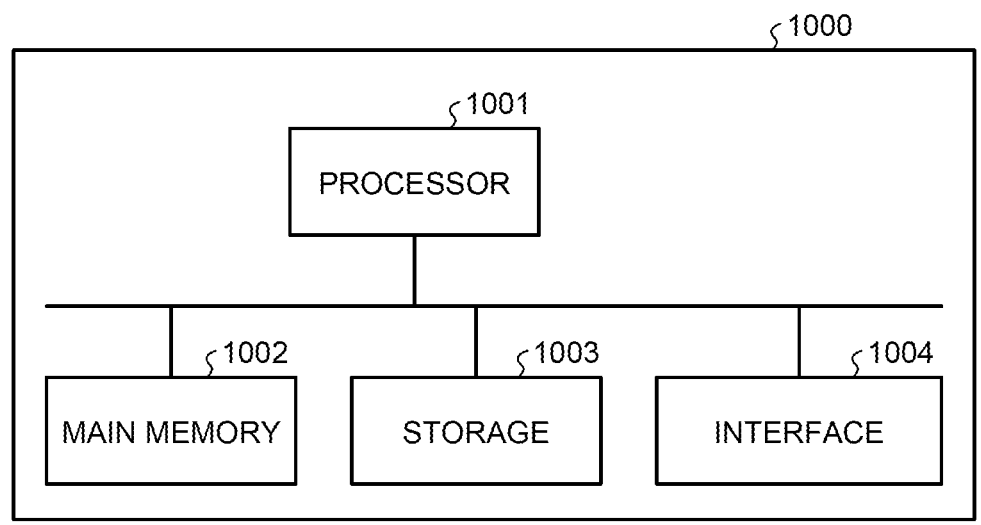
FIG. 8 is a block diagram illustrating an example of a computer system according to the embodiment.

FIG. 8 is a block diagram illustrating an example of a computer system 1000 according to the embodiment. Each of the feedforward control unit 7, the feedback control unit 8, the output unit 9, and the storage unit 10 includes the computer system 1000. Each computer system 1000 includes a processor 1001, such as a central processing unit (CPU), a main memory 1002 including a nonvolatile memory, such as a read only memory (ROM), and a volatile memory, such as a random access memory (RAM), a storage 1003, and an interface 1004 including an input/output circuit. Each function of the feedforward control unit 7, the feedback control unit 8, the output unit 9, and the storage unit 10 described above is stored in the corresponding storage 1003 as a program. Each processor 1001 reads the program from the storage 1003 to load the program into the main memory 1002, and executes the above-described processing in accordance with the program. It should be noted that the program may be distributed to the computer system 1000 via a network.

The computer system 1000 is capable of calculating the temperature regulation amount $MV_{ff}$ by which the thermoregulating unit 50 regulates the temperature, on the basis of the detection data of the first temperature sensor 5, calculating the temperature regulation amount $MV_{fb}$ by which the thermoregulating unit 50 regulates the temperature, on the basis of the detection data of the second temperature sensor 6, and outputting the control signal to the driving circuit 45 on the basis of the temperature regulation amount $MV_{ff}$ and the temperature regulation amount $MV_{fb}$, in accordance with the foregoing embodiment.

Note that all or some of the feedforward control unit 7, the feedback control unit 8, the output unit 9, and the storage unit 10 may be configured by the single computer system 1000. Alternatively, each of the feedforward control unit 7, the feedback control unit 8, the output unit 9, and the storage unit 10 may be configured by the different computer system 1000.

[Performance Test Results]

Results of a performance test conducted to verify the performance of the smoother 3 will be next described. The performance test was conducted with respect to the temperature control device 1 including the pump 2, the smoother 3, and the thermoregulator 4 as illustrated in FIG. 1.

In the performance test, a predetermined temperature fluctuation amount $\Delta T_{in}$ was given to the fluid F that was to flow into the first inlet 31 of the smoother 3 in predetermined cycles. Hereinafter, the temperature fluctuation amount $\Delta T$ is indicated in amplitude. More specifically, a disturbance d with which the temperature fluctuation amount $\Delta T_{in}$ exhibits a temperature fluctuation of about 0.5° C. with a cycle of 10 seconds was given to the fluid F that was to flow into the first inlet 31. The temperature fluctuation amount $\Delta T$ was then measured at each of a first measurement position MP1 set in the first inlet 31 of the smoother 3, a second measurement position MP2 set in the first outlet 33 of the smoother 3, and a third measurement position MP3 set in the second outlet 43 of the thermoregulator 4.

Moreover, in the performance test, the temperature fluctuation amount $\Delta T$ of the fluid F was measured when the temperature control device 1 was controlled by respective three control methods. The first control method is a control method in which feedback control is performed by the feedback control unit 8 and feedforward control is not performed by the feedforward control unit 7. The second control method and the third control method are a control method in which the feedforward control by the feedforward control unit 7 and the feedback control by the feedback control unit 8 are performed. In the second control method, the first position P1 at which the first temperature sensor 5 is installed is set in the smoothing channel 32 near the first outlet 33. In the third control method, the first position P1 at which the first temperature sensor 5 is installed is set in the smoothing channel 32 near the first inlet 31.

Figure 9:
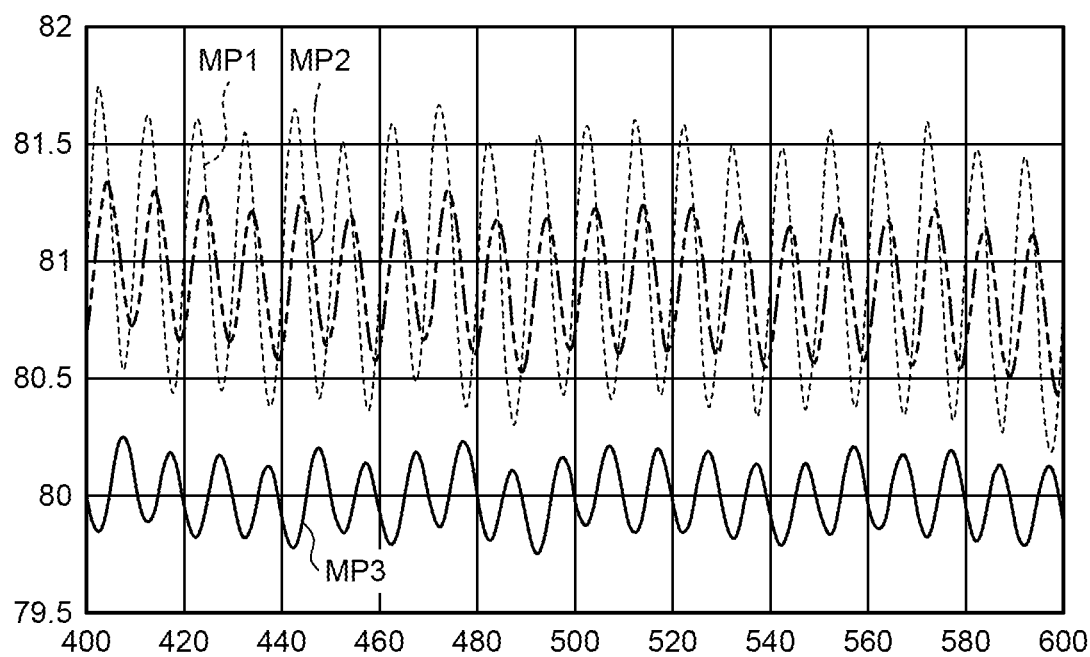
FIG. 9 is a diagram illustrating results of a performance test on the smoother.
Figure 10:
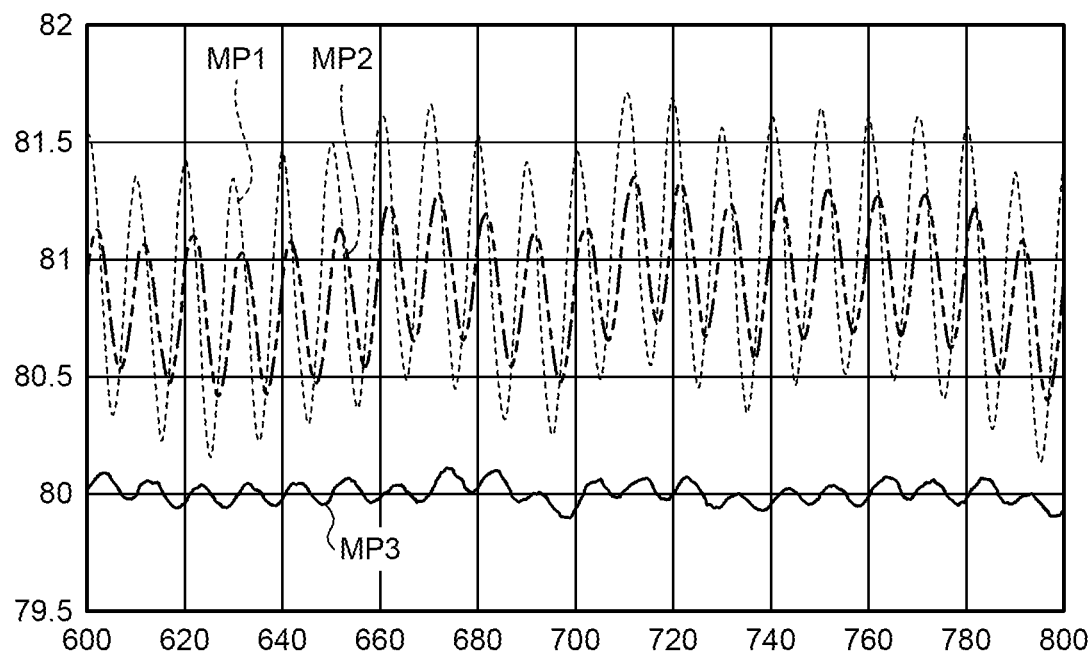
FIG. 10 is a diagram illustrating results of a performance test on the smoother.
Figure 11:
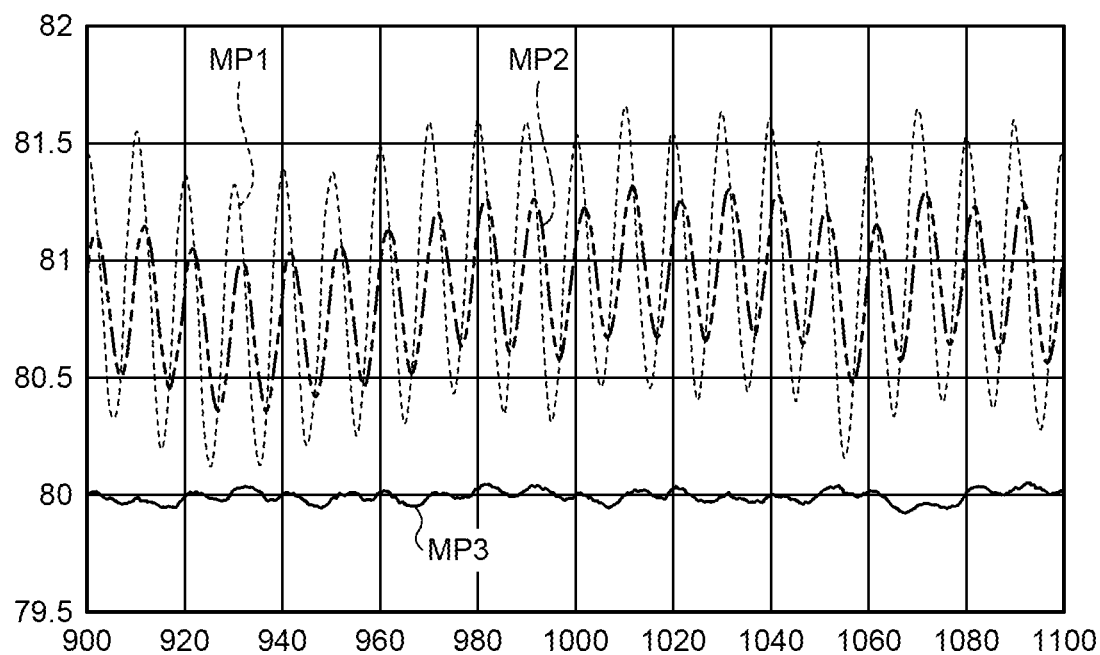
FIG. 11 is a diagram illustrating results of a performance test on the smoother.

FIG. 9, FIG. 10, and FIG. 11 are each a diagram illustrating results of the performance test on the smoother 3. FIG. 9 is a diagram illustrating results of the performance test on the smoother 3 in the first control method. FIG. 10 is a diagram illustrating results of the performance test on the smoother 3 in the second control method. FIG. 11 is a diagram illustrating results of the performance test on the smoother 3 in the third control method. In the graph illustrated in each of FIG. 9, FIG. 10, and FIG. 11, the horizontal axis represents time and the vertical axis represents temperature (the temperature fluctuation amount $\Delta T$). Line MP1 indicates the temperature fluctuation amount $\Delta T$ at the first measurement position MP1, line MP2 indicates the temperature fluctuation amount $\Delta T$ at the second measurement position MP2, and line MP3 indicates the temperature fluctuation amount $\Delta T$ at the third measurement position MP3.

As illustrated by the line MP1 in each of FIG. 9, FIG. 10, and FIG. 11, in a case where the temperature fluctuation that was the temperature fluctuation amount $\Delta T_{in}$ of about 0.5° C. in a cycle of 10 seconds was given to the fluid F in the first inlet 31, it was confirmed that the temperature fluctuation amount $\Delta T$ was limited to about 0.3° C. in the first outlet 33, as indicated by each line MP2. In other words, it was confirmed that the smoother 3 enabled the temperature fluctuation amount $\Delta T$ of the fluid F in the first outlet 33 to be made smaller than the temperature fluctuation amount $\Delta T_{in}$ of the fluid F in the first inlet 31.

In the case of the first control method, the temperature fluctuation amount $\Delta T$ at the third measurement position MP3 is about 0.2° C. as illustrated in FIG. 9. In the case of the second control method, the temperature fluctuation amount $\Delta T$ at the third measurement position MP3 is about 0.07° C. as illustrated in FIG. 10. In the case of the third control method, the temperature fluctuation amount $\Delta T$ at the third measurement position MP3 is about 0.005° C. as illustrated in FIG. 11.

As understood from a result of a comparison of FIG. 9, FIG. 10, and FIG. 11, it was confirmed that performing both the feedforward control and the feedback control enabled the temperature fluctuation amount $\Delta T$ of the fluid F after temperature regulation in the thermoregulator 4 to be further limited than in a case where only the feedback control was performed.

Moreover, as understood from a result of a comparison of FIG. 10 and FIG. 11, it was confirmed that the longer the distance between the first position P1, at which the first temperature sensor 5 was installed, and the second inlet 41 was, in other words, the longer the flow-through necessary time FT was, the greater the temperature fluctuation amount $\Delta T$ of the fluid F after temperature regulation in the thermoregulator 4 was able to be limited.

Other Embodiments

In the above embodiment, the first temperature sensor 5 is provided in the smoother 3 and detects the temperature of the fluid F that is flowing through the smoothing channel 32. The first temperature sensor 5 may be provided in the first inlet 31 and detect the temperature T of the fluid F that is flowing into the first inlet 31. The first temperature sensor 5 may be provided in the first pipe 11 and detect the temperature T of the fluid F that is flowing through the first pipe 11.

The invention claimed is:

1. A temperature control device comprising:
a smoother including a first inlet into which a fluid flows, a smoothing channel through which the fluid having flowed from the first inlet flows, and a first outlet from which the fluid having flowed through the smoothing channel flows out, the smoother being configured to make a temperature fluctuation amount of the fluid in the first outlet smaller than a temperature fluctuation amount of the fluid in the first inlet;
a thermoregulator including a second inlet into which the fluid having flowed out from the first outlet flows, a thermoregulating channel through which the fluid having flowed from the second inlet flows, a thermoregulating unit configured to regulate a temperature of the fluid flowing through the thermoregulating channel, and a second outlet from which the fluid having flowed through the thermoregulating channel flows out;
a first temperature sensor configured to detect a first temperature of the fluid at a first position set in the smoothing channel;
a second temperature sensor configured to detect a second temperature of the fluid at a second position downstream of the second outlet;
a feedforward control unit configured to, based on detection data of the first temperature sensor, calculate a temperature regulation amount by which the thermoregulating unit regulates the temperature; and
a feedback control unit configured to, based on detection data of the second temperature sensor, calculate a temperature regulation amount by which the thermoregulating unit regulates the temperature,
wherein the feedforward control unit is configured to calculate the temperature regulation amount based on (i) dynamic characteristics of the thermoregulator and (ii) dynamic characteristics of the first temperature sensor.

2. The temperature control device according to claim 1, wherein the dynamic characteristics of the thermoregulator include a dead time of the thermoregulating unit.

3. The temperature control device according to claim 2, wherein a flow-through necessary time required for the fluid to flow through from the first position to the second inlet is longer than the dead time.

4. The temperature control device according to claim 3, wherein the feedforward control unit is configured to, based on the detection data of the first temperature sensor, the dynamic characteristics of the thermoregulator including the dead time, the dynamic characteristics of the first temperature sensor, and the flow-through necessary time, calculate the temperature regulation amount to cancel a change, from a target temperature, in the first temperature of the fluid at the first position.

5. The temperature control device according to claim 1, wherein the first position is set in the smoothing channel.

6. The temperature control device according to claim 1, wherein the smoothing channel includes a curved potion.

7. The temperature control device according to claim 1, wherein the smoother further comprises rough portions that are disposed an inside surface of the smoothing channel and surround the smoothing channel.

8. The temperature control device according to claim 1, wherein the thermoregulating unit includes a thermoelectric module, and
the temperature regulation amount includes at least one of an amount of heat absorption and an amount of heat liberation by the thermoelectric module.

9. The temperature control device according to claim 1, further comprising:
one or more non-transitory memory devices that store the dynamic characteristics of the thermoregulator and the dynamic characteristics of the first temperature sensor.

10. The temperature control device according to claim 1, wherein the dynamic characteristics of the thermoregulator correspond to a sum of dynamic characteristics of the fluid and dynamic characteristics of the thermoregulating unit.

11. The temperature control device according to claim 1, wherein the dynamic characteristics of the first temperature sensor correspond to a preset equation, $G_{ts1}(s)$, that represents the first temperature sensor and satisfies a following equation:

$$G_1(s) \times d + G_{ff}(s) \times G_2(s) \times G_{ts1}(s) \times d = 0, \text{ where}$$

$G_1(s)$ denotes dynamic characteristics of the fluid,
$G_{ff}(s)$ denotes dynamic characteristics of the feedforward control unit,
$G_2(s)$ denotes dynamic characteristics of the thermoregulating unit, and
d denotes a disturbance in the temperature fluctuation amount of the fluid in the first inlet.

12. The temperature control device according to claim 11, wherein the dynamic characteristics of the thermoregulator correspond to the dynamic characteristics of the thermoregulating unit, $G_2(s)$, and satisfy a following equation:

$$G_2(s) = \overline{G}_2(s) \cdot e^{-Ls}, \text{ where}$$

L denotes a dead time of the thermoregulating unit.

* * * * *